United States Patent
Yao

(10) Patent No.: US 9,391,247 B2
(45) Date of Patent: Jul. 12, 2016

(54) HIGH POWER LEDS WITH NON-POLYMER MATERIAL LENSES AND METHODS OF MAKING THE SAME

(75) Inventor: Zhimin Jamie Yao, Santa Barbara, CA (US)

(73) Assignee: CREE, INC., Durham, NC (US)

(*) Notice: Subject to any disclaimer, the term of this patent is extended or adjusted under 35 U.S.C. 154(b) by 931 days.

(21) Appl. No.: 12/970,789

(22) Filed: Dec. 16, 2010

(65) Prior Publication Data

US 2012/0153306 A1    Jun. 21, 2012

(51) Int. Cl.

| | |
|---|---|
| *H01L 29/18* | (2006.01) |
| *H01L 33/58* | (2010.01) |
| *H01L 27/15* | (2006.01) |
| *H01L 33/54* | (2010.01) |

(52) U.S. Cl.
CPC ............ *H01L 33/58* (2013.01); *H01L 27/156* (2013.01); *H01L 33/54* (2013.01); *H01L 2224/48091* (2013.01); *H01L 2224/48247* (2013.01); *H01L 2224/73265* (2013.01)

(58) Field of Classification Search
CPC ...................................................... H01L 29/18
See application file for complete search history.

(56) References Cited

U.S. PATENT DOCUMENTS

| 4,946,547 | A | 8/1990 | Palmour et al. ............... 156/643 |
|---|---|---|---|
| 5,200,022 | A | 4/1993 | Kong et al. ..................... 156/612 |
| 7,213,940 | B1 | 5/2007 | Van de Ven et al. ........... 362/231 |
| 2008/0006840 | A1 | 1/2008 | Camras et al. |
| 2008/0023719 | A1* | 1/2008 | Camras et al. .................... 257/98 |
| 2008/0099774 | A1 | 5/2008 | Tan et al. |
| 2009/0321861 | A1* | 12/2009 | Oliver ............... H01L 27/14618 257/432 |
| 2011/0084294 | A1 | 4/2011 | Yao .................................. 257/88 |

FOREIGN PATENT DOCUMENTS

EP          2197051 A2     6/2010

OTHER PUBLICATIONS

International Search Report and Written Opinion from Application No. PCT/US2011/065581, dated Apr. 23, 2012.
US RE34681, 02/1995, Davis et al. (withdrawn).
CREE EZ700 LED Data Sheet, 2007 EZBright LEDs.

* cited by examiner

*Primary Examiner* — Marvin Payen
(74) *Attorney, Agent, or Firm* — Koppel, Patrick, Heybl & Philpott

(57) ABSTRACT

LED chips and packages are disclosed having lenses made of materials that resist degradation at higher operation temperatures and humidity, and methods of fabricating the same. The lenses can be made of certain materials that can withstand high temperatures and high humidity, with the lenses mounted to the LED prior to certain critical metallization steps. This helps avoid damage to the metalized part that might occur as a result of the high mounting or bonding temperature for the lens. One embodiment of an LED chip comprises a flip-chip LED and a lens mounted to the topmost surface of the flip-chip LED. Lenses can be bonded to LEDs at the wafer level or at the chip level. The lens comprises a non-polymer material and the LED chip is characterized as having substantially no polymer materials in contact with the LED chip.

22 Claims, 4 Drawing Sheets

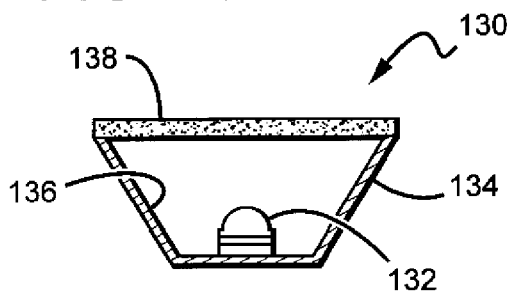
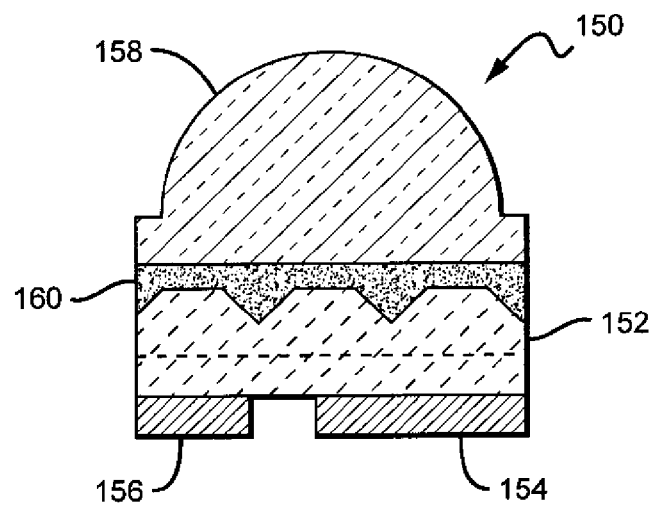
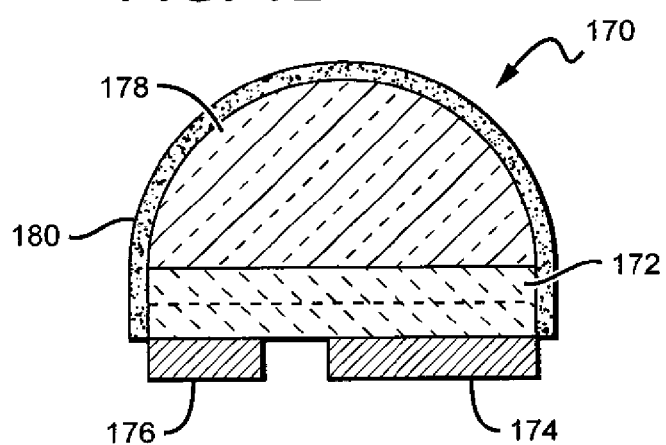

HIGH POWER LEDS WITH NON-POLYMER MATERIAL LENSES AND METHODS OF MAKING THE SAME

BACKGROUND OF THE INVENTION

1. Field of the Invention

This invention relates to light emitting diodes (LED) and in particular LEDs using lenses made of non-polymer materials.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangements, it is known to enclose an LED chip in a package to provide environmental and/or mechanical protection, color selection, light extraction, light focusing and the like. An LED package can also include electrical leads, contacts or traces for electrically connecting the LED package to an external circuit. FIG. 1 shows a conventional LED package that generally comprises a single LED chip 12 mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 can be filled with an encapsulant material 16 which can contain a wavelength conversion material such as a phosphor. Light emitted by the LED at a first wavelength can be absorbed by the phosphor, which can responsively emit light at a second wavelength. The entire assembly is then encapsulated in a clear protective resin 14, which may be molded in the shape of a lens or dome over the LED chip 12.

Conventional protective resins or lenses can be made of polymer materials such as silicones or epoxies, and the softening point for the polymer materials is relatively low. This allows softened polymer materials to be deposited directly on the LED without damage to LED metalized components, such as contacts, wire bonds, mirrors, reflective cups, leads, etc.

FIG. 2 shows another conventional LED package 20 that may be more suited for high power operations that can generate more heat. In the LED package 20, one or more LED chips 22 are mounted onto a carrier such as a printed circuit board (PCB) carrier, substrate or submount 23. A reflector 24 can be included on the submount 23 that surrounds the LED chip(s) 22 and reflects light emitted by the LED chips 22 away from the package 20. Different reflectors can be used such as metal reflectors, omni-directional reflectors (ODRs), and distributed Bragg reflectors (DBRs). The reflector 24 can also provide mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond. The encapsulant can be made of a relatively low melting point material to avoid damage to the metalized components of the package 20.

Many LED components for solid state lighting applications attempt to achieve high light output by operating single LED chips at as high as possible current and at a low voltage typical for individual LEDs. FIGS. 3a and 3b show one commercially available LED 30 available from Cree® Inc. under the EZ700™ LED product designation. The LED comprises a single LED junction 32 as well as a current spreading structure 34 on its top to spread current from the top contact 36. Current spreading layers can also be included. The particular voltage level for these types of single junction LED chips can be dependent upon the particular material system used for the LEDs and the voltage necessary based on junction voltage. For example, some Group-III nitride based LEDs can have junction voltage in the 2.5 to 3.5 volt range and increased luminous flux for these LEDs can be achieved by applying elevated current levels. LEDs such as these can also be provided with a lens or encapsulant as discussed above.

Operating an LED chip with high current can result at elevated chip temperatures, and heat from the LED chip can spread to surrounding parts of the LED package, including but not limited to the PCB, substrate or submount, as well as the lens or encapsulant ("lens"). Many lenses can be made of one or more polymer compounds such as epoxies and silicones. These can be fabricated in many different ways such as being formed directly over the LED, or formed separately and then mounted over the LED. For the desired operation, these lenses should maintain substantially the same transparency through their lifetime. However, high temperatures from the highly driven LEDs can spread to the lens, causing the lens heat-up. This can cause the polymer material of the lenses to degrade more quickly than would typically occur with operation under lower temperatures, and this degradation can result in certain undesirable effects for the LED package. In some cases the lens can become discolored or browned or even cracked, which can significantly reduce the transparency of the lens and can result in absorption of LED light passing through the lens. This in turn can reduce the overall emission efficiency of the package. This discoloration can also result in a shift in the color of light emitted by the package.

Lenses made of non-polymer materials such as glass, quartz and sapphire, can be more robust than lenses made of polymer materials, and can resist discoloration in response to elevated temperatures. It is not, however, practical to form these over conventional LEDs in the same way that polymer lenses are formed. Molding non-polymer lenses on an LED chip can present certain manufacturing challenges. In the case of glasses, the temperature for substantial softening can be approximately 400° C. or higher depending on the composition of the glass. Other crystalline transparent materials such as quartz have very high melting temperatures. These crystalline non-polymer lenses could be formed separately and then mounted over an LED with a polymer material such as a silicone or epoxy, but this presents the same potential problem of having a polymer material that can degrade when under elevated temperatures. The elevated temperatures can damage metalized components of the LED such as the contacts, wire bonds, reflectors, etc. The most severe damage is to the metal-to-semiconductor contact.

SUMMARY OF THE INVENTION

The present invention is generally directed to LED chips and packages having lenses made of materials that resist degradation at higher operation temperatures and/or high humidity, and methods of fabricating the same. These lenses can be mounted to the LED prior to certain critical metallization steps. This helps avoid damage to the metalized part that might occur as a result of the high bonding or mounting temperature for the lens.

One embodiment of an LED chip according to the present invention comprises a flip-chip LED and a lens mounted to the topmost surface of the flip-chip LED. The lens comprises a non-polymer material and the LED chip is characterized as having substantially no polymer materials in contact with the LED chip.

One embodiment of an LED chip wafer, according to the present invention comprises a plurality of LEDs in a wafer, the wafer being flip-chip oriented. A plurality of lenses is mounted to the topmost surface of the wafer, wherein the lenses comprise a non-polymer material and wherein there is no polymer materials in contact with the wafer where emitted light comes through.

A method for forming a plurality of LED chips, comprising fabricating a plurality of LEDs and fabricating a plurality of lenses is made of one or more non-polymer materials. The plurality of lenses is mounted to the plurality of LEDs using one or more non-polymer bonding materials.

A method for fabricating LED chips, comprising fabricating a plurality of LEDs on a semiconductor growth wafer and flip-chip orienting the wafer such that the growth wafer is the topmost surface a plurality of lenses are molded on the growth wafer, wherein the lenses comprise an non-polymer material.

These and other aspects and advantages of the invention will become apparent from the following detailed description and the accompanying drawings which illustrate by way of example the features of the invention.

BRIEF DESCRIPTION OF THE DRAWINGS

FIG. 3b is a side elevation view of the LED chip in FIG. 3a;

FIG. 10 is a sectional view of one embodiment of an LED package according to the present invention;

FIG. 11 is a sectional view of still another embodiment of an LED chip according to the present invention; and FIG. 12 is a sectional view of another embodiment of an LED package according to the present invention.

DETAILED DESCRIPTION OF THE INVENTION

Figure 1:
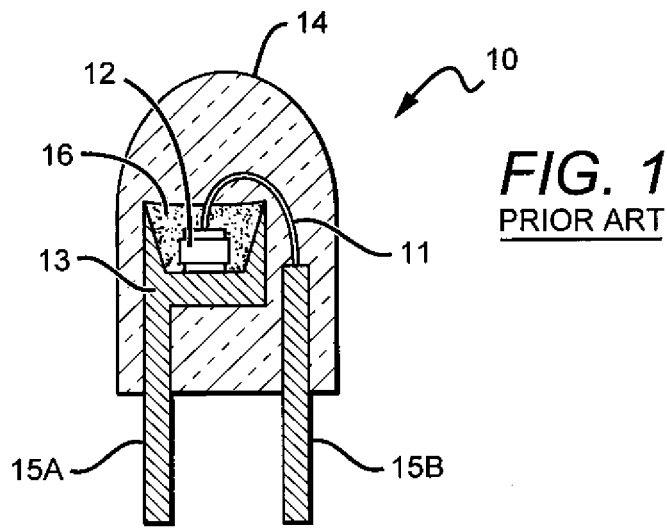
FIG. 1 shows a sectional view of a prior art LED package.
Figure 2:
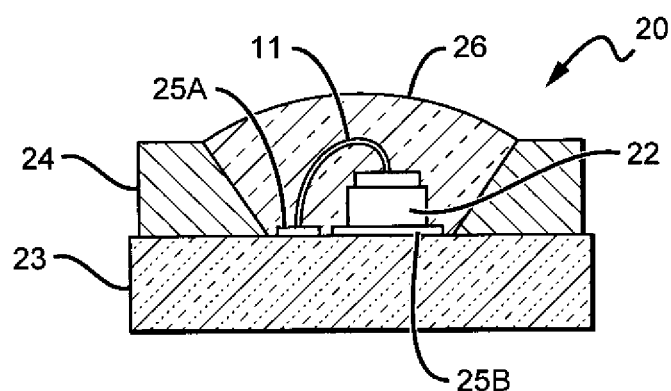
FIG. 2 shows a sectional view of another prior art LED package.
Figure 3A:
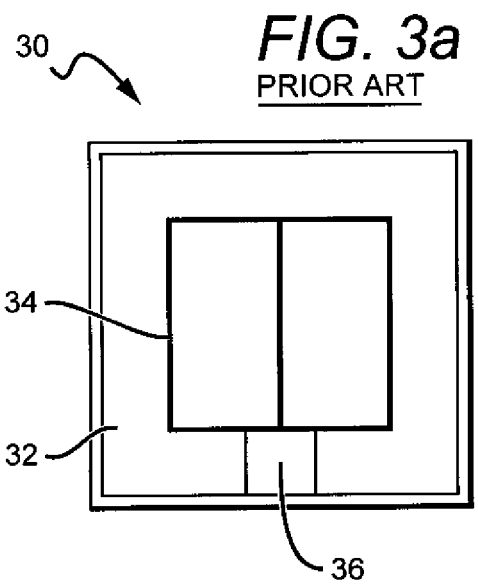
FIG. 3a shows a top view of a prior art LED chip according to the present invention.
Figure 3B:
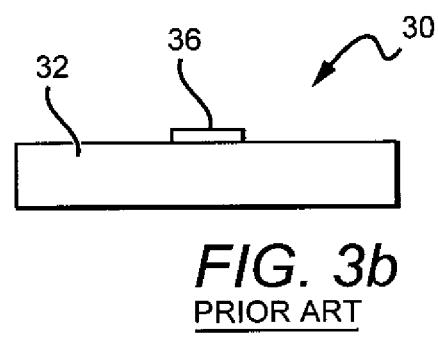

The present invention is directed to LED chips and LED packages, and methods for fabrication of the same. In particular, the present invention is directed to LED chips and LED packages ("LED chip" or "LED chips") fabricated having lenses (or encapsulants) that withstand degradation from environmental conditions such as elevated temperatures. The lenses can be made of many different materials that can have some or all of the following characteristics. The material should be substantially transparent to the light emitted by the LED chip and the light converted by wavelength converters, and it should maintain its transparency over time, even when exposed to elevated temperatures and/or high humidity. The material should also have a coefficient of thermal expansion (CTE) that is similar to that of the LED semiconductor material. This allows for reliable operation through different temperature cycles.

The lens material should also have an index of refraction (IR) that allows for efficient light extraction from the LED chip. In some embodiments the refractive index can be in the range of 1 to 2, while in other embodiments it can be in the range of 1.4 to 1.6. In some embodiments the refractive index can be approximately 1.5. The lens material should also be capable of being formed in dome, such as by molding, etching, or grinding.

The lens can be attached to the LED chip without the use of polymer materials such as silicones or epoxies. This allows some LED chip embodiments to be provided without having polymer materials in contact with the epitaxial material or growth substrate of the LED. Accordingly, the amount of non-polymer material subjected to heat from the LED is minimized or eliminated completely, which results in an LED chip that withstands degradation in response to elevated temperatures and humidity. In some embodiments, the lenses can comprise non-polymer materials such as glass, sapphire or quartz, but it is understood that other materials can also be used. Glass is relatively inexpensive and is easily formed in a dome shape such as in a mold. The desired shapes can also be formed by chemical etching. In some embodiments, the lenses according to the present invention can be molded directly to the LED, while in other embodiments the lens can be attached using one or more non-polymer, transparent materials. In embodiments where the lenses are attached to the LED Different materials can be used to attach the lens including but not limited to spin-on glass or flowable glass, both of which are commercially available. Other inorganic adhesives can also be used such as glass or ceramics.

The present invention allows for the use of high softening temperature and melting temperature materials for the lenses whose use would otherwise be impractical. The present invention allows for metallization of the LED chip after formation or mounting of the lens. The present invention is particularly applicable to lateral geometry LEDs or other LEDs arranged to allow for contacting from one side. Prior to metallization, the lens can be molded or mounted in place on one side of the LED, and the other side can be metalized to include features such as reflectors, contacts, electrodes, etc. This results in wire-bond free devices that can be mounted directly to a package, submount or PCB. Metalizing after mounting of the lens prevents damage that could occur to these metalized components during formation or bonding of the lens.

It is understood that the present invention can be used in different types of LEDs having different geometries and can be used with a single LED and those having multiple or an array of LEDs. It is further understood that the present invention can be used for wafer level fabrication of LED chips or package, or can be used for fabrication of a single LED chip or groups of less than all LED chips on the wafer.

As further described below, in wafer level fabrication a plurality of LED chips can be fabricated on or part of a growth wafer. Further processing steps can take place and one step in the manufacturing process can be mounting a lens array to the wafer, with each of the lenses arranged over the desired number of LED chips. In other embodiments, single lenses can be mounted to the wafer over the desired number of LEDs. The LED wafer can then be metalized and can then be singulated into individual or groups of LED chips using known singulating methods. It is understood that other features can be included in the LEDs at the wafer level or after signalization including texturing, shaping or beveling to increase light extraction.

The present invention is described herein with reference to certain embodiments, but it is understood that the invention can be embodied in many different forms and should not be construed as limited to the embodiments set forth herein. In particular, the present invention is described below in regards to mounting lenses over particular types of emitters, but it is understood that the lenses can be mounted over many different emitters beyond those described herein. For example the present invention is also applicable to the LEDs disclosed in U.S. patent application Ser. No. 12/905,995, titled "High Voltage Wire Bond Free LEDs," which is incorporated herein by reference.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", "below", "first", and 'second' and similar terms, may be used herein to describe a relationship of one layer or another region. It is understood that these terms are intended to encompass different orientations of the device in addition to the orientation depicted in the figures.

It is noted that the terms "layer" and "layers" are used interchangeably throughout the application. A person of ordinary skill in the art will understand that a single "layer" of semiconductor material may actually comprise several individual layers of material. Likewise, several "layers" of material may be considered functionally as a single layer. In other words, the term "layer" does not denote a homogenous layer of semiconductor material. A single "layer" may contain various dopant concentrations and alloy compositions that are localized in sub-layers. Such sub-layers may function as buffer layers, contact layers or etch-stop layers, for example. These sub-layers may be formed in a single formation step or in multiple steps. Unless specifically stated otherwise, the Applicant does not intend to limit the scope of the invention as embodied in the claims by describing an element as comprising a "layer" or "layers" of material.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
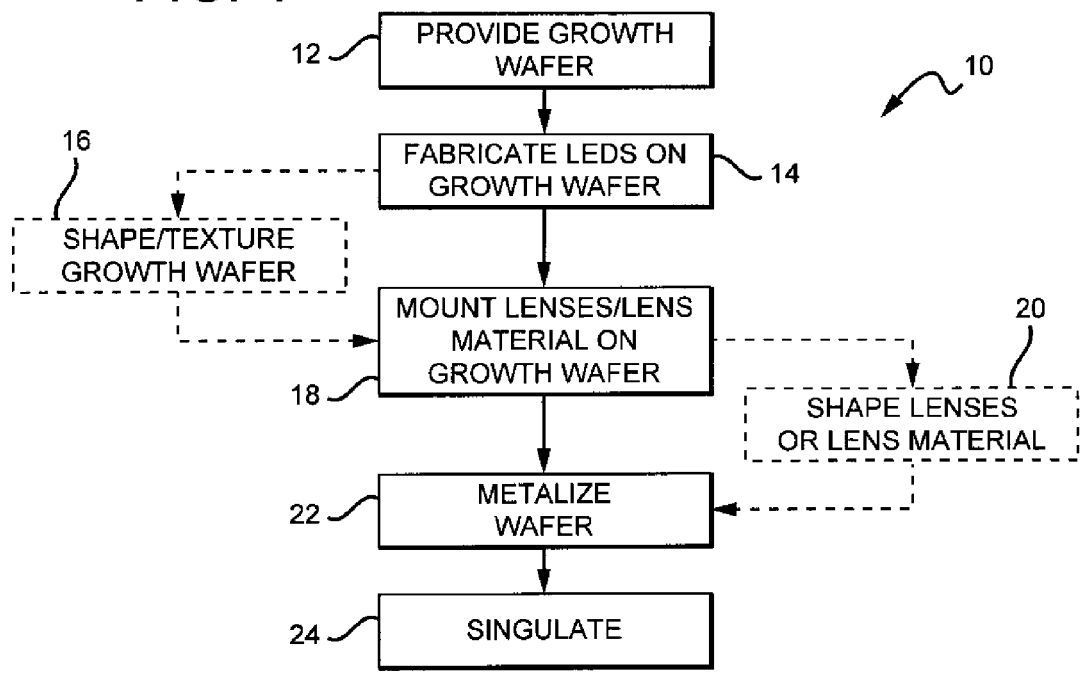
FIG. 4 is a flow diagram for one embodiment of a method according to the present invention.

FIG. 4 shows one embodiment of method 10 for fabricating LED chips according to the present invention. Although steps are being shown in a particular order it is understood that the steps can occur in a different order and different steps can be used. The present method is described with reference to the fabrication of LEDs, but it is understood that it can be used to fabricate other solid state emitters and other semiconductor devices.

In step 12 a growth wafer is provided upon which a plurality of LEDs can be fabricated using known semiconductor fabrication techniques. The wafer can be made of many materials such as sapphire, aluminum nitride (AlN), GaN, silicon carbide, with a suitable wafer being a 4H polytype of silicon carbide, although other silicon carbide polytypes can also be used including 3C, 6H and 15R polytypes. Silicon carbide has certain advantages, such as a closer crystal lattice match to certain materials, such as Group III nitrides, compared to other wafer materials such as sapphire. Using silicon carbide can also result in Group III nitride films of higher quality. Silicon carbide also has a very high thermal conductivity so that the total output power of Group-III nitride devices on silicon carbide is not limited by the thermal dissipation of the wafer (as may be the case with some devices formed on sapphire). SiC wafers are available from Cree Research, Inc., of Durham, N.C. and methods for producing them are set forth in the scientific literature as well as in a U.S. Pat. Nos. Re. 34,861; 4,946,547; and 5,200,022.

In step 14, LEDs are fabricated on a growth wafer or substrate, and the LEDs can have many different semiconductor layers arranged in different ways. The fabrication and operation of LEDs is generally known in the art and only briefly discussed herein. The layers of the LEDs can be fabricated using known processes with a suitable process being fabrication using metal polymer chemical vapor deposition (MOCVD). The layers of the LEDs generally comprise an active layer/region sandwiched between first and second oppositely doped epitaxial layers, all of which are formed successively on the growth wafer or substrate ("wafer"). The LED layers can initially be formed as continuous layers across the substrate with the layers then partitioned or separated into individual LEDs. This separation can be achieved by having portions of the active region and doped layers etched down to the wafer to form the open areas between the LEDs. In other embodiments the active layer and doped layers can remain continuous layers on the wafer and can be separated into individual devices when the LED chips are singulated.

It is understood that additional layers and elements can also be included in each of the LEDs, including but not limited to buffer, nucleation, contact and current spreading layers as well as light extraction layers and elements. The active region can comprise single quantum well (SQW), multiple quantum well (MQW), double heterostructure or super lattice structures, and as is understood in the art, the oppositely doped layers are commonly referred to as n-type and p-type doped layers.

The LEDs may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the n- and p-type layers are gallium nitride (GaN) and the active region is InGaN. In alternative embodiments the n- and p-type layers may be AlGaN, aluminum gallium arsenide (AlGaAs) or aluminum gallium indium arsenide phosphide (AlGaInAsP).

It is understood that the LEDs on the wafer can have different geometries, with some embodiments having lateral geometry wherein both n- and p-type layers can be contacted from one side of the LED chip. Lateral geometry LEDs are particularly applicable to flip-chip mounting in packages, such that the n-type layer and/or the growth substrate (in embodiments where growth substrate is not removed) are the LEDs primary emitting surface. Vertical geometry LEDs also can be fabricated according to the present invention with a first layer or contact accessible from one side and a second contact or layer accessible from the opposite side. In certain embodiments, however, this may result in the need for additional processing to provide an access to one of the layers through the lens wafer for electrical connection.

As discussed above, to the extent that the contacts or current spreading grids contain metals or other materials with relatively low melting temperatures, and metal to semiconductor contacts that are sensitive to temperature, the step of depositing or forming the contacts does not occur until after a lens is formed or mounted on the LED. This helps avoid the damage to the metalized features that can occur when mounting lenses made of non-polymer materials at elevated temperatures. The same holds true for other features that can include metals such as contacts, reflectors, wire bonds, etc.

In step 16 the growth substrate can go through an optional shaping or texturing step and in different embodiments this can include forming bevels or waffle cuts in the substrate, or otherwise texturing or shaping the substrate surface to enhance light extraction. In other embodiments the growth substrate can be thinned or removed, and in the embodiments where it is removed, the epitaxial layers can be processed to include texturing or shaping. This in turn requires the growth wafer be bonded to a temporary wafer/substrate as a support. Many different substrate thinning or removal processes can be used including known grinding and/or etching processes. In other embodiments a portion of the growth substrate remains can be shaped. All of these processes can enhance light extraction from the LED.

In step 18, lenses or a lens material is mounted to the LED wafer with the desired lens material being arranged over the desired area of the growth wafer. The lens material can be provided in the desired shape such as domes, or can be provided as a layer of lens material that can be formed into the desired shape later as described below. In one embodiment, the lens material comprises an interconnected lens array. As discussed above, the lenses are preferably made of material that is transparent to the light emitted by the LED and/or light converted by converters and withstands degradation from environmental conditions such as elevated temperatures and high humidity. More particularly, the lens should maintain its physical and optical properties such as shape, transparency and refractive index over time, even when exposed to elevated temperatures and high humidity. The material should also have a coefficient of thermal expansion that is similar to that of the LED semiconductor material to provide for reliable operation through different temperature cycles. The lens material should also have a refractive index that allows for efficient light extraction. In some embodiments the refractive index can be in the range of 1 to 2, while in other embodiments it can be in the range of 1.4 to 1.6. In some embodiments the refractive index can be approximately 1.5. The lens material should also be capable of being formed in a dome, such as by molding, etching or grinding.

The lenses according to the present invention can be made of many different materials discussed above, with a suitable material being glass, which is readily available, relatively inexpensive, and capable of being formed into shapes such as domes. Different types of glass having different compositions can have different melting temperatures, with some having melting temperatures as low as approximately 400° C., and others having melting temperatures as high as 1700° C. or higher.

In the embodiments where the lenses are provided in an array of interconnected lenses, that array of lenses can be sized to be mounted to the LED wafer covering all or some of the LED chips-to-be areas. In some embodiments the lens array can be sized to cover the entire LED wafer and can be mounted to the LED wafer using different mounting methods. In flip-chip embodiments, the lens array can be mounted directly to the growth substrate or in embodiments where the growth substrate is removed, to the exposed epitaxial layer (e.g. n-type layer). The flip chip LEDs in the array have not yet been metalized to include contacts, reflectors, wire bonds, etc. Accordingly, the wafer and its epitaxial layers can withstand mounting of the lenses at elevated temperatures without experiencing damage to the metalized features.

The lenses can be mounted to the wafer using different techniques, such as molding directly to the wafer. The lens wafer surface can soften at certain elevated temperature and pressure and intern forms a bond with the LED growth wafer surface. Alternatively, the lens array can be formed separately from the LED wafer and then bonded to the wafer using a non-polymer material that is also resistant to degradation under elevated temperatures and humidity. Different commercially available transparent bonding materials can be used, such as commercially available spin-on glass or flowable glass available from Dow Corning Corporation. It is understood that many other materials can also be used.

In step 20, the lens material or lens array can go through the optional step of shaping into the desired final shape to the extent that the material is not provided with its final lens shape. Many different shaping methods can be provided including known etching, cutting and grinding methods.

In step 22, the non-polymer lenses are now in place on the LED wafer, and the wafer can be metalized to deposit the metal features. Each of the LEDs can have first and second contacts, and in the cases where the LEDs have lateral geometry, both contacts can be accessible from one surface of the LEDs as further described below. In one such embodiment, one of the contacts can be in electrical contact with the LEDs n-type layer and the other contact can be in electrical contact with the LED's p-type layer.

The first and second contacts can comprise many different materials such as Au, copper (Cu) nickel (Ni), indium (In), aluminum (Al) silver (Ag), or combinations thereof. Still other embodiments can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as junction resistivity and sheet resistance, as well as optical characteristics such as transparency, reflectivity, absorption and reflectivity. In the case of Group-III nitride devices, it is known that a thin semitransparent current spreading layer typically can cover portions of the LED to assist with current spreading from the contacts to the LED. The LEDs can also comprise additional current spreading structures or grids. The contacts can be formed using different methods such as sputtering and evaporation. Other metalized features such as contacts, electrodes, reflectors, electrical traces, vias, etc can also be formed using known methods as described below. For lateral flip-chip LEDs, the metallization can provide metal features on the LED wafer on the surface opposite the lenses.

In step 24, the LED wafer can be singulated into individual LED chips or groups of LED chips using known methods such as dicing, scribe and breaking, or etching. The singulation process separates each of the lenses in the array such that each non-polymer lens is over the desired number of LEDs. In some embodiments, each singulated device comprises at least one LED chip, with one or more lenses. The singulated LED chips provide the advantage of not having polymer materials in contact with the epitaxial layers or the growth substrate. This reduces the discoloration that can occur from the breakdown of the non-polymer material as a result of high temperature and/or high humidity operation.

In some embodiments, there may be some polymer materials in contact with the epitaxial layers, but not in contact with the primary emission surface or surfaces of the LED. To the extent that any heat related discoloration occurs in the polymer material, it does not significantly reduce the emission of the LED through the primary emission surfaces. Following singulating, the devices can be mounted in a package, or to a submount or printed circuit board (PCB) with electrical connection on the metalized elements on the LED chip and electrical traces on the package/submount/PCB.

It is understood that the methods according to the present invention can also be used beyond mounting non-polymer lenses to LEDs at the wafer level, but can also be used to mount a lens to a single LED or to mount a lens over a group of LEDs. The process is similar, with the resulting LED chip or package being metalized following mounting of the non-polymer lens. The lens can be mounted without the use of non-polymer materials so that there is no polymer material that can degrade due to the LED operation.

Figure 5:
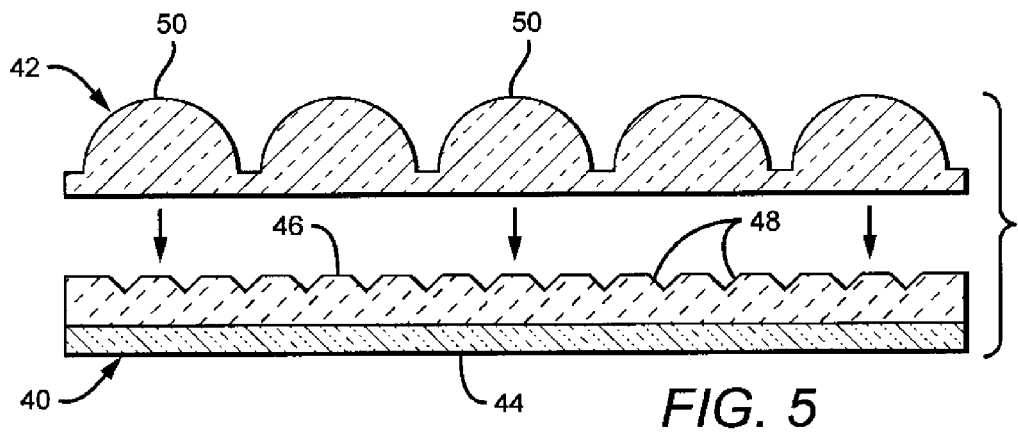
FIG. 5 is a sectional view of an LED wafer according to the present invention during fabrication.

FIG. 5 shows one embodiment of an LED wafer 40 and lens array 42 that can be utilized in the method described above to fabricate LED chips according to the present invention. The LED wafer 40 comprises epitaxial material 44 grown on a growth substrate 46 as described above. The epitaxial material 44 is shown as a single layer, but it is understood that it can comprise many layers, including but not limited to a p-type layer, active region, and n-type layer as described above. The LED wafer 40 is flipped such that the growth substrate 46 is the top layer, with this arrangement being utilized in flip-chip arrangements. The growth substrate comprises bevels 48 in its top surface that can be formed using known etching, cutting or grinding techniques. The bevels are included to enhance light extraction from the LED chip, and it is understood that other light extraction features can be included such as micrometer range scaled texturing or shaping. At the state of its fabrication as shown, the LED wafer has not yet been metalized, so that it can withstand the heat from mounting of lenses at elevated temperatures.

The lens array 42 comprises a plurality of connected lenses 50 with the array 42 that can be mounted to the LED wafer 40. As mentioned above, the LED array is preferably formed of a transparent material that is resistant to degradation from heat and humidity and has the CTE and IR characteristics described above. In some embodiments the lens array 42 can comprise a non-polymer material such as those described above, with a suitable material being glass. In some embodiments the LED array can be formed directly on the LED wafer using molding techniques where the softened glass is molded on the wafer. Using this method, the glass from the lens fills the bevels 48.

Figure 6:
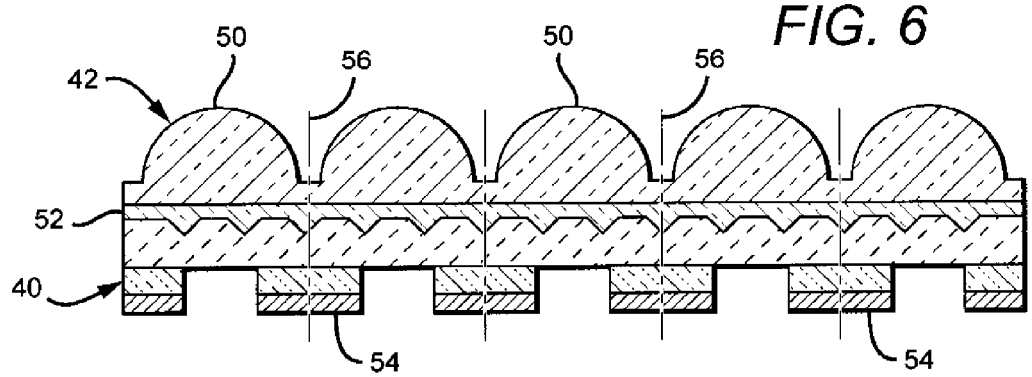
FIG. 6 is sectional view of the LED wafer shown in FIG. 5 during fabrication.

Referring now to FIG. 6, in the embodiment shown the lens array 42 is mounted on the LED wafer 40 using an alternative method to molding. The lens array 42 is mounted to the LED wafer 40 using a bonding material 52, and in this embodiment the bonding material preferably comprises a non-polymer bonding material, such as those described above. The bonding agent can be applied to the LED wafer 40 with the lens array mounted to the LED wafer with the bonding agent substantially filling the space between the two.

The LED array can be provided with the lenses in the desired shape, so no further processing or shaping of the lenses is required as discussed in the method above. Following mounting of the lens array 42, the LED can be etched to form the LEDs on the wafer into the desired lateral geometry so that the LEDs can be contacted from the same side. The wafer can also be etched to provide additional features and layers, including but not limited to vias, insulating layers, reflective layers, etc. These features are described below, but are not shown in FIGS. 5-7 to simplify the drawings and the description herein. Metal layers/materials 54 can now be deposited on the LED wafer using the methods described above, with the metal layers/materials 54 are capable of comprising contacts, reflectors, conductive traces, etc.

Figure 7:
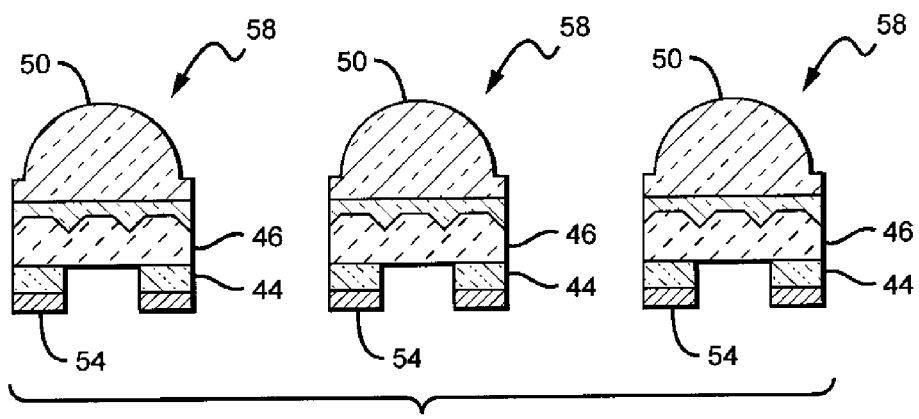
FIG. 7 is a sectional view of LED chips singulated from the LED wafer shown in FIG. 6.

Phantom lines 56 are shown in FIG. 6 to illustrate singulating locations that can be used when singulating the wafer into individual LED chips. Referring now to FIG. 7, LED chips 58 are shown singulated from the LED wafer 40. Although only three LED chips 58 are shown, it is understood that many more LED chips can be formed from a single wafer. For example, when fabricating LED chips having a 1 millimeter (mm) square size, up to 4500 LED chips can be fabricated on a 3 inch wafer. Each LED chip has its own lens 50, portion of epitaxial material 44, portion of the growth substrate 46, and metal layers 54 at which an electrical signal is applied to the LED chip 58. Each of the LED chips 58 is capable of being mounted to an LED package, submount or PCB as described above.

Figure 8:
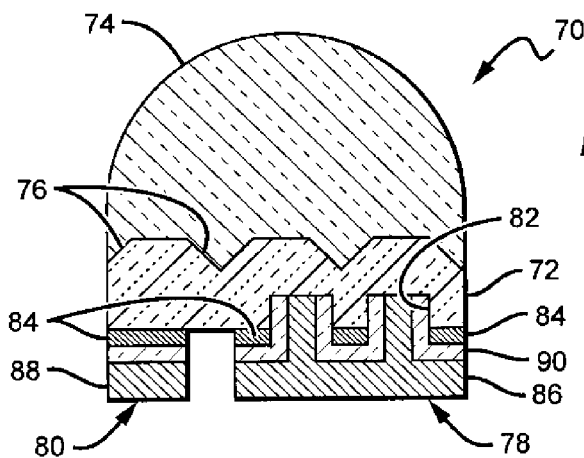
FIG. 8 is a sectional view of another embodiment of an LED chip according to the present invention.

FIG. 8 shows another embodiment of an LED chip 70 according to the present invention having an epitaxial material 72 that can comprise the layers described above. A lens 74 is included on the epitaxial material 72 either through the molding or bonding processes described above. The lens 74 should be transparent, resistant to breakdown, and should have the CTE and IR characteristics described above, with lenses made of non-polymer materials such as glass.

In this embodiment, the growth substrate for the epitaxial material has been removed and as mentioned above, the epitaxial material can comprise many different layers/regions as described above, including but not limited to an active region sandwiched between and n-type layer and a p-type layer. The top surface of the epitaxial layer comprises micrometer scaled textures that can be formed using the methods described above, with the texture to enhance light extraction.

Pursuant to the method described above, following mounting of the lens 74, one or more LED chips 70 can be metalized. The LED chips 70 can be etched prior to metallization (either before or after mounting of lens) to form the LED chip into the desired geometry. In the embodiment shown, the LED chip 70 can be etched to a lateral geometry so that the LED chip can be contacted from the side opposite the lens 74, or can be provided with other features to allow electrical contact to the n-type and p-type layers. Forming to lateral geometry can comprise removing a portion of one of said n-type and p-type layers, and a portion of the active region to form a contact mesa. In the embodiments where the p-type layer is the bottom-most layer, portions of the p-type layer and the active region can be removed to form a contact mesa on the n-type layer. In alternative arrangements vias can be formed through the bottommost one of the n-type and p-type layers, and through the active region, to contact the other of the n-type and p-type layers.

The LED chip 70 comprises a first contact area 78 for applying an electrical signal to one of the n-type and p-type layers, and a second contact area 80 for applying an electrical signal to the other of said n-type and p-type layers. Vias 82 are formed through the bottommost one of the n-type and p-type layers, through the active region, to the other said n-type and p-type layers. A reflector 84 is deposited on each of the first and second contact areas 78, 80 to reflect light emitted toward the bottom of the LED chip 70 back to the lens 74. This light can then contribute to useful emission from the LED chip 70. Different materials can be used for the reflector 84 such as one or more metal layers, or one or more semiconductors layers in a Distributed Bragg Reflector (DBR), or combinations thereof. In the embodiment shown, the vias 82 are only under the first contact area 78 and the reflector 84 has openings aligned with the vias 82.

A first contact/electrode 86 is included on the first contact area 78 and a second contact/electrode 88 is included on the second contact area 80. Insulating layer 90 can be included over the reflector and on the inside surfaces of the vias 82 to provide electrical isolation between the n-type and p-type semiconductor layers and isolation between metallization and semiconductor layers.

Figure 9:
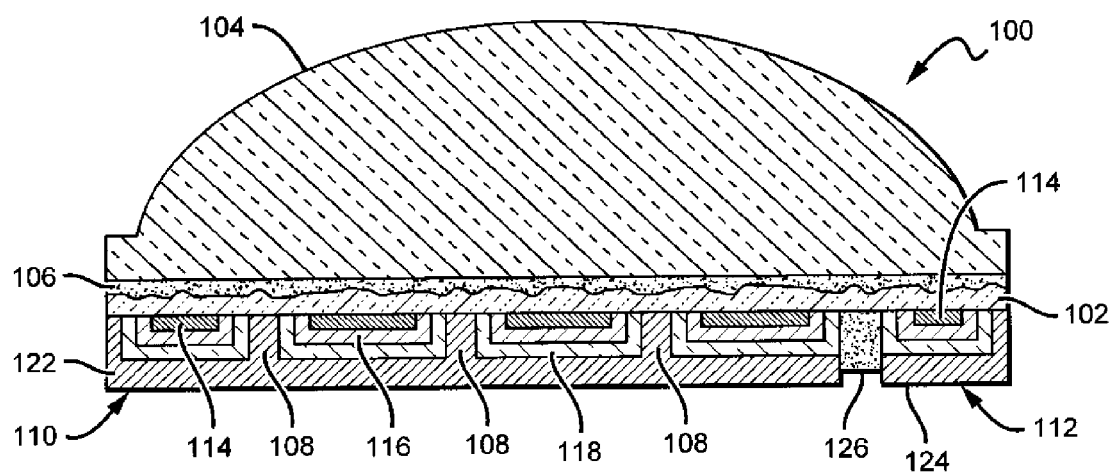
FIG. 9 is a sectional view of still another embodiment of an LED chip according to the present invention.

It is understood that different LED chips according to the present invention can be arranged in different ways with many different layers and features. FIG. 9 shows another embodiment of an LED chip 100 according to the present invention having epitaxial material 102 with the growth substrate removed. The surface of the epitaxial material 102 is textured to enhance light extraction, and a lens 104 is mounted to the epitaxial material, using a bonding material 106 as described above. In this embodiment, a temporary support wafer is bonded to the LED wafer before the growth substrate is removed. This temporary support wafer is removed after lens wafer is bonded to the LED wafer. Before or after mounting of the lens 104, the LED chip can be etched to form it in the desired geometry and/or to form vias 108 as described above. The LED chip 100 comprises first and second contact areas 110, 112 and following mounting of the lenses the LED chip 100 can be metalized.

Reflectors 114 can be deposited on the surface of both the first and second contact areas 110, 112, with holes in the reflectors in the first contact area 110 aligned with the vias 108. A barrier layer 116 is included over each of the reflectors 114 to block migration of elements to and from the reflectors 114. An insulting layer 118 is provided over the barrier layer 116 under the first contact area to provide electrical isolation between the reflectors 114 and the layers above the insulating layer 118. This layer 118 also electrically isolates the P-type and the N-type semiconductor layers. First and second electrodes 122, 124 can be deposited over the first and second contact areas 110, 112. Insulating gap filler 126 can then be used to fill the gaps left through manufacturing.

During operation of the embodiments described above, an electrical signal can be applied to the first and second electrodes causing the LED to emit light. The present invention is applicable to low or high power LEDs operating in response to different drive signals. Some embodiments can be driven with a relatively high power that can cause them to generate elevated levels of heat. Some of the heat will spread to the lens, but because the lens is made of the materials described above, it resists degradation.

The different embodiment of the present invention can be used with conversion materials to convert at least some of the light emitted from the LED, with the overall LED chip emitting a combination of light from the LED and the conversion material. In some embodiments, the LED chip can emit a white light combination of light from the LED, in the conversion material, and in some embodiments additional LED chips can be included. Techniques for generating white light from a plurality of light sources to provide improved color rendering index (CRI) at the desired color temperature have been developed that utilize different hues from different discrete light sources. Such techniques are described in U.S. Pat. No. 7,213,940, entitled "Lighting Device and Lighting Method". In one such arrangement 452 nm peak blue InGaN LEDs were coated with a yellow conversion material, such as a YAG:Ce phosphor, to provide a color that was distinctly yellow and has a color point that fell well above the black body locus on the CIE diagram. Blue emitting LEDs coated by yellow conversion materials are often referred to as blue shifted yellow (BSY) LEDs or LED chips. The BSY emission is combined with the light from reddish LEDs that "pulls" the yellow color of the yellow LEDs to the black body curve to produce warm white light.

The conversion material in the embodiment shown can be arranged in many different ways and can comprise many different materials. In some embodiments it can be integral to the LED chips, such as through a layer or coating. In other embodiments, the conversion material can be integral or part of the lens or the package where the LED chip is mounted.

FIG. 10 is one embodiment of an LED package 130 according to the present invention comprising an LED chip 132 as described above, mounted at the base of reflective cup 134. The reflective cup 134 can have reflective side surfaces 136 with light from the LED chip 132 emitting directly out of the opening in the reflective cup 134 or reflected off the reflective surfaces 136 and out the opening. A conversion material 138 can be included over the reflective cup opening, with the conversion material covering at part of or the entire reflective cup opening. The conversion material can be formed over the opening using many different known methods including dispense methods, spin coating, and electrophoretic deposition. In other embodiments, the conversion material can be formed separately from the LED package and can be mounted over the reflective cup opening.

In some embodiments, the conversion material 138 can comprise a binder and phosphor mixture and different factors determine the amount of LED light that will be absorbed by the phosphor/binder coating in the final LED chips, including but not limited to the size of the phosphor particles, the percentage of phosphor loading, the type of binder material, the efficiency of the match between the type of phosphor and wavelength of emitted light, and the thickness of the phosphor/binding layer. These different factors can be controlled to control the emission wavelength of the LED chips according to the present invention.

Different materials can be used for the binder, with materials preferably being robust after curing and substantially transparent in the visible wavelength spectrum. Suitable materials include but not limited to glass, BCB, polymides and silicones. Non-polymer materials such as glass are the preferred materials since they have higher resistance to high temperature and humidity. In other embodiments, the binder material can be engineered to be index matched with the features such as the chip (semiconductor material) and growth substrate, which can reduce total internal reflection (TIR) and improve light extraction.

Many different phosphors can be used in the conversion material 138 according to the present invention. (not true)In one embodiment according to the present invention LED chips 132 can emit light in the blue wavelength spectrum and the phosphor absorbs some of the blue light and re-emits yellow and/or red and/or green light. The LED package 130 emits a white light combination of blue and yellow light. In one embodiment the phosphor comprises commercially available YAG:Ce, although a full range of broad yellow, red and green spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:

$Tb_{3-x}RE_xO_{12}$:Ce(TAG); RE=Y, Gd, La, Lu; or
$Sr_{2-x-y}Ba_xCa_ySiO_4$:Eu.

First and second phosphors can also be combined for higher CRI white of different white hue (warm white) with the yellow phosphors above combined with red phosphors. Different red phosphors can be used including:

$Sr_xCa_{1-x}$S:Eu, Y; Y=halide;
$CaSiAlN_3$:Eu; or
$Sr_{2-y}Ca_ySiO_4$:Eu

Other phosphors can be used to create saturated color emission by converting substantially all light to a particular color. For example, the following phosphors can be used to generate green saturated light:

$SrGa_2S_4$:Eu;
$Sr_{2-y}Ba_ySiO_4$:Eu; or
$SrSi_2O_2N_2$:Eu.

The following lists some additional suitable phosphors that can be used as conversion particles in LED package 130, although others can also be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4$:$Eu^{2+}$
$Ba_2(Mg,Zn)Si_2O_7$:$Eu^{2+}$
$Gd_{0.46}Sr_{0.31}Al_{1.23}O_xF_{1.38}$:$Eu^{2+}_{0.06}$
$(Ba_{1-x-y}Sr_xCa_y)SiO_4$:Eu
$Ba_2SiO_4$:$Eu^{2+}$ Red
$Lu_2O_3$:$Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:$Pr^{3+}$, $Ga^{3+}$
$CaAlSiN_3$:$Eu^{2+}$
$Sr_2Si_5N_8$:$Eu^{2+}$ Different sized phosphor particles can be used including but not limited to 10-100 nanometer(nm)-sized particles to 20-30 μm sized particles, or larger. Smaller particle sizes typically scatter and mix colors better than larger sized particles to provide a more uniform light. Larger particles are typically more efficient at converting light compared to smaller particles, but emit a less uniform light. In one embodiment, the particle sizes are in the range of 2-5 μm.

The conversion material 138 can also have different concentrations or loading of phosphor materials in the binder, with a typical concentration being in range of 30-70% by weight. In one embodiment, the phosphor concentration is approximately 65% by weight, and is preferably uniformly dispersed throughout the binder. Still in other embodiments the coating can comprise multiple layers of different concentrations of types of phosphors, or a first coat of clear silicone or glass can be deposited followed by phosphor loaded layers.

It is understood that the conversion material 138 can also comprise scattering particles in a binder material to further disperse and mix light passing through the conversion material. The scattering particles can be provided in different concentrations depending on the application and materials used. A suitable range for scattering particle concentration is from 0.01% to 0.2%, but it is understood that the concentration can be higher or lower. In some embodiments the concentration can be as low as 0.001%. It is also understood that the scattering particle layer can have different concentrations of scattering particles in different regions. For some scattering particles there can be an increase in loss due to absorption for higher concentrations. Thus, the concentrations of the scattering particles can be chosen in order to maintain an acceptable loss figure, while at the same time dispersing the light to provide the desired emission pattern.

The scattering particles can comprise many different materials including but not limited to:
silica gel;
zinc oxide (ZnO);
yttrium oxide ($Y_2O_3$);
titanium dioxide ($TiO_2$);
barium sulfate ($BaSO_4$);
alumina ($Al_2O_3$);
fused silica ($SiO_2$);
fumed silica ($SiO_2$);
aluminum nitride;
glass beads;
zirconium dioxide ($ZrO_2$);
silicon carbide (SiC);
tantalum oxide ($TaO_5$);
silicon nitride ($Si_3N_4$);
niobium oxide ($Nb_2O_5$);
boron nitride (BN); or
phosphor particles (e.g., YAG:Ce, BOSE)

More than one scattering particles in various combinations of materials or combinations of different forms of the same material may be used to achieve a particular scattering effect. It is understood that in other embodiments the scattering particles can be included in other portions of the LED package 130.

FIG. 11 is another embodiment of an LED chip 150 according to the present invention having a textured growth substrate material, first and second contacts 154, 156 for applying an electrical signal, and a lens 158 that can be made of the materials described above. The lens 158 comprises a conversion material 160 that can be included as part of the lens 158 or as a layer between the lens 159 and the growth substrate. In one embodiment it can be included in the binding material used to bond the lens 158 to the epitaxial material 152. Any of the binding materials mentioned above can be used, that comprise a non-polymer material that resists degradation in response to heat and humidity. Alternatively, the conversion material 160 can be included as part of the lens or can be a separate layer formed on the growth substrate. A pre-form of the conversion material cab be glued/attached onto the growth substrate using a non-polymer material. The conversion material 160 or the lens 158 can also comprise scattering particles as described above.

FIG. 12 shows still another embodiment of an LED chip 170 according to the present invention having growth substrate material 200, first and second contacts 174, 176 for applying an electrical signal, and a lens 178 that can be made of the materials described above. In this embodiment, a conversion material 180 can be included on the lens 178 as a separate layer comprising a phosphor material and binder, or as a layer within the lens 178. The conversion material 180 can be deposited using many known techniques such as dispense, molding or spraying and in this embodiment the phosphor in the conversion material is spaced from the LED active region such that less heat transfers to the conversion material during operation.

The present invention can be used with many different LEDs arranged in different ways. The conversion material can be arranged in many different ways both remote to and integral to the LED chip, and the conversion material can take many different shapes. As mentioned above, the present invention can also be used with LEDs having vertical geometry. This can require the additional processing steps of forming an access through the lens so that one or the n-type and p-type layers can be contacted through the hole. The layer could then be wire bonded through the hole.

The present invention can be used in many different lighting applications, and in particular those using a small sized high output light source. Some of these include, but are not limited to, street lights, architectural lights, home and office lighting, and display lighting.

Although the present invention has been described in detail with reference to certain preferred configurations thereof, other versions are possible. Therefore, the spirit and scope of the invention should not be limited to the versions described above.

I claim:

1. A light emitting diode (LED) chip, comprising:
a flip-chip LED;
a lens mounted to a topmost surface of said flip-chip LED, wherein said lens comprises a non-polymer material and wherein there is substantially no polymer materials in contact with said LED, said lens further comprising one or more planar surfaces and a curved surface, wherein said one or more planar surfaces extend away from said curved surface, said one or more planar and curved surfaces opposite said topmost surface of said flip-chip LED; and
a non-polymer bonding material to mount said lens to said LED, wherein said bonding material is interposed between said lens and said LED such that said LED does not contact said lens.

2. The LED chip of claim 1, wherein said lens is made of a material resistant to degradation at elevated temperatures and humidity.

3. The LED chip of claim 1, wherein said flip chip LED comprises a growth substrate, wherein said growth substrate is said topmost layer.

4. The LED chip of claim 3, wherein said growth substrate comprises light extraction features.

5. The LED chip of claim 1, wherein said lens is substantially transparent to the light emitted by the LED and the light converted by a converter.

6. The LED chip of claim 1, wherein said lens comprises a material comprising a coefficient of thermal expansion substantially the same as the LED material.

7. The LED chip of claim 1, wherein said lens material comprises an index of refraction in the range of 1 to 2.

8. The LED chip of claim 1, wherein said lens material comprises an index of refraction in the range of 1.4 to 1.6.

9. The LED chip of claim 1, wherein said lens comprises glass, sapphire, or quartz.

10. The LED chip of claim 1, further comprising a non-polymer bonding material to mount said lens to said LED.

11. The LED chip of claim 10, wherein said bonding material comprises spin-on glass or flowable glass.

12. The LED chip of claim 1, wherein said LED comprises lateral geometry.

13. A light emitting diode (LED) chip wafer, comprising:
a plurality of LEDs in a wafer, each of which comprises a top surface; and
a plurality of lenses mounted to a topmost surface of said wafer, wherein said lenses comprise a non-polymer material and wherein there is substantially no polymer materials in contact with said wafer, wherein each of said plurality of lenses comprises one or more planar surfaces and a curved surface, wherein said one or more planar surfaces extend away from said curved surface, said one or more planar and curved surfaces opposite said topmost surface of said wafer; and
a non-polymer bonding material to mount said lenses to said LEDs, wherein said bonding material is interposed between said lenses and said LEDs such that said LEDs does not contact said lenses.

14. The LED wafer of claim 13, further comprising a growth substrate, wherein said plurality of LEDs are on said growth substrate, and said growth substrate is said topmost surface.

15. The LED chip wafer of claim 13, further comprising features to enhance light extraction.

16. The LED chip wafer of claim 13, wherein said lenses are formed in a lens array.

17. The LED chip wafer of claim 13, wherein said lenses are made of a material resistant to degradation at elevated temperatures and humidity.

18. The LED chip wafer of claim 13, wherein each of the lenses are substantially transparent to the light emitted by said LEDs and the light converted by phosphors.

19. The LED chip wafer of claim 13, wherein said lenses comprise an index of refraction in the range of 1 to 2.

20. The LED chip wafer of claim 13, wherein said lenses comprise glass, sapphire, or quartz.

21. The LED chip wafer of claim 13, further comprising a non-polymer bonding material to mount said lenses to said wafer.

22. The LED chip of claim 13, wherein at least some of said LEDs comprise a lateral geometry.

* * * * *